(12) United States Patent
Gembris et al.

(10) Patent No.: US 6,388,443 B1
(45) Date of Patent: May 14, 2002

(54) COMPUTER FOR EVALUATING SIGNALS FROM NUCLEAR MAGNETIC RESONANCE TOMOGRAPHY AND A NUCLEAR RESONANCE TOMOGRAPH EQUIPPED WITH SAID COMPUTER

(75) Inventors: Daniel Gembris, Dortmund (DE); Stefan Posse, Grosse Point Park, MI (US); John Taylor, Barnes (GB)

(73) Assignee: Forschungszentrum Jülich GmbH, Jülich (DE)

( * ) Notice: Subject to any disclaimer, the term of this patent is extended or adjusted under 35 U.S.C. 154(b) by 21 days.

(21) Appl. No.: 09/618,244

(22) Filed: Jul. 18, 2000

Related U.S. Application Data

(63) Continuation-in-part of application No. PCT/DE99/00126, filed on Jan. 20, 1999.

(30) Foreign Application Priority Data

Jan. 23, 1998 (DE) .......................................... 198 02 337

(51) Int. Cl.$^7$ ................................................. G01V 3/00
(52) U.S. Cl. ........................ 324/312; 324/307; 324/300
(58) Field of Search ................................ 324/312, 307, 324/300, 322; 600/544, 545

(56) References Cited

U.S. PATENT DOCUMENTS

| | | | | |
|---|---|---|---|---|
| 5,621,321 A | * | 4/1997 | Liu et al. | |
| 5,797,853 A | * | 8/1998 | Musha et al. | |
| 5,887,074 A | * | 3/1999 | Lai et al. | 382/128 |
| 5,901,246 A | * | 5/1999 | Hofflburg et al. | 382/209 |
| 5,994,902 A | * | 11/1999 | Xiang et al. | 324/307 |
| 6,081,750 A | * | 6/2000 | Hofflburg et al. | 700/17 |

OTHER PUBLICATIONS

Cox, R.W. et al., "Real–Time Functional Magnetic Imaging", *Magnetic Resonance Imaging*, Feb. 1, 1995, pp. 230–236.

Bandettini, P.A., "Processing Strategies for Time–Course Data Sets in Functional MRI of the Human Brain", *Magnetic Resonance in Medicine*, Aug. 1, 1993, pp. 161–173.

Zhang et al., "The Effect of Magnetization Transfer on Functional MRI Signals", *Magnetic Resonance in Medicine*, Aug. 1, 1997, pp. 187–192.

M. Singh et al., "Separation of Veins from Activated Brain Tissue in Functional Magnetic Resonance Images", *Nuclear Science Symposium and Medical Imaging Conference*, IEEE Press, Oct. 30, 1994, pp. 1534–1536.

A.L. Paradis et al., "Detection of Periodic Signals in Brain Echo–Planar Functional Images", 18$^{th}$ *Annual International Cnference of the IEEE/Press*, Oct. 31, 1996, pp. 696–697.

G.Z. Yang et al., "In vivo Blood Flow Visualization with Magnetic Resonance Imaging", *Proceedings of Visualization with Magnetic Resonance Imaging, IEEE Press*, Oct. 22–25, 1991, pp. 202–209.

\* cited by examiner

*Primary Examiner*—Edward Lefkowitz
*Assistant Examiner*—Brij B. Shrivastav
(74) *Attorney, Agent, or Firm*—K. J. Bach

(57) ABSTRACT

In a computer for evaluating signals from nuclear magnetic resonance tomography and a tomograph using such a computer, the neuronal activity measured during a nuclear magnetic resonance tomographic examination follows a protocol, which reproduces the temporal sequence of stimuli. During a correlation analysis, the sensitivity of known means to changes in the signal-response form normally decreases with each activation cycle. According to the invention, better evaluation results can be achieved in the correlation analysis by using a constant number of n data values in a correlation analysis employing a sliding-window technique. As the data measurement progresses, the oldest value is continuously disposed of and the most recent data value utilized in the calculation.

14 Claims, No Drawings

COMPUTER FOR EVALUATING SIGNALS FROM NUCLEAR MAGNETIC RESONANCE TOMOGRAPHY AND A NUCLEAR RESONANCE TOMOGRAPH EQUIPPED WITH SAID COMPUTER

This is a continuation-in-part application of international patent application PCT/DE99/00126 filed Jan. 20, 1999 and claiming the priority of German patent application 198 02 337.5 filed Jan. 23, 1998.

BACKGROUND OF THE INVENTION

The invention relates to a computer for evaluating signals from nuclear magnetic resonance tomography and a nuclear resonance tomograph equipped with such a computer.

In medical research, it is desirable to obtain information with respect to the brain activity or, in a wider sense, information concerning the blood flow or the deoxyhemoglobin concentration changes in animal and human organs. The neural activation results in an increase of the blood flow in activated brain areas, which causes a decrease in the blood deoxyhemoglobin concentration. Deoxyhemoglobin (DOH) is a paramagnetic compound which accelerates the nuclear spin-dephasing. If the DOH concentration is lowered because of a brain activity which causes a blood flow, the dampening effect on the NMR radiation in the active areas of the brain is reduced, so that NMR signals (nuclear magnetic resonance signals) of the water contained in the brain have a higher intensity. Mainly the protons of the hydrogen in the water become excited. DOH consequently has a dampening effect on the NMR radiation. It is reduced as a result of brain activity and consequently, permits a localization of the brain activity if examinations utilizing NMR methods are performed. This action mechanism is known in the field under the name BOLD effect (Blood Oxygen Level Dependent-effect) and results in susceptibility-sensitive magnetic resonance measurements at a field strength of a static magnetic field of for example 1.5 Tesla in up to about 10% changes of the image brightness in the activated brain regions. The endogenic contrast compound DOH may be replaced by other contrast compounds, which cause a change in the susceptibility. With NMR imaging methods, layers or volumes are selected which, with suitable input of high-frequency radiation pulses and the application of magnetic gradient fields, provide a measuring signal, which is digitized and stored in the measuring computer in a two- or three-dimensional field.

Normally, FFT is used, but the use of other transformations might also be used. From the recorded raw data, the desired image information is reconstructed by way of a two- or three-dimensional Fourier transformation.

A reconstructed slice image consists of pixels, a volume data set consists of voxels. A pixel is a two-dimensional image element, for example a square, of which the image is composed. A voxel is a three-dimensional volume element, for example a block which, because of measuring techniques, has no sharp limit. The dimensions of a pixel are in the range of 1 mm$^2$, those of a voxel are in the range of 1 mm$^3$. The geometries and dimensions are variable.

Although the images of the measured slices are only two-dimensional, the term "voxel" is also used for them By a comparison of the measured signals in each pixel with the time-dependent plot model function, a stimulus-specific neural activation can be detected and localized. A stimulus may be for example a somato-sensoric, an acoustic, a visual or an olefactoric stimulus as well as a mental or motor task.

The model function or, respectively, model time series describes the expected signal change of the magnetic resonance signal as a result of neural activation. Those may be derived or example by empirical rules from the paradigm of the respective experiments. It is essential to take into consideration a time delay of the model function with respect to the paradigm (slow reaction of the blood flow to neural activation).

It is already known how brain activation can be represented by images, which were derived from nuclear spin tomographic data. The computation and the display of the activation images are even possible on a real-time basis that is an image can be created from a data set before the next set of data is obtained. The time gap is typically 1 to 3 seconds.

The most widely used method of detecting neural activity is the correlation analysis. It is realized by computation of the cross-correlation coefficients between a reference vector, that is a model time series, and the time sequences of the voxels taken into consideration. The real time capability of a correlation algorithm requires that the time needed for the renewed computation of the correlation coefficients is constant for each new set of magnetic resonance data recorded.

A real time correlation analysis is known from Cox, R. W., Jesmanowicz, A., J. S. Magn. Reson, Med., 33 230, 1955, which supports the suppression of low-frequency noise by means of a detrending procedure. In a detrending procedure, one tries to reduce the effect of non-stimulus induced signal changes into the time sequences measured. This means mathematically that the measurement vector, that is, the vector which includes the measured time sequence of a voxel is split into the sum of two orthogonal vectors. The part, which is described by a linear combination of detrending vectors, is discarded. The detrending vectors, which in a mathematical sense form a basis, include the time series by whose weighted sum the complete low frequency noise part of the measured time series is described ("complete" within the limits of the given detrending vectors). By applying detrending to the measuring and reference vectors entering with the correlation computations, the effect of non-stimulus induced signal changes on the correlation images can be reduced.

With the application of detrending, the correlation coefficient ρ is calculated according to the formula (1).

$$\rho = \frac{\vec{x}_s \vec{r}_s}{|\vec{x}_s||\vec{r}_s|} \quad (1)$$

Wherein:
 ρ=correlation coefficient
 $\vec{x}_s$=measurement vector after detrending
 $\vec{r}_s$=reference vector after detrending Furthermore, Cox, R. W. presented in Comput. Biomed. Res. 29, 162, 1996, the program AFNI, which is based on the algorithm of the first-mentioned publication. The known algorithm is based on elements of a matrix which is obtained by Cholesky analysis of another matrix which is composed of the scalar products of the measurement and reference vectors as well as the detrending vectors.

The neural activation measured with a nuclear spin tomographic examination follows the stimulation paradigm, that is the protocol, which represents the timing of the stimuli. Usually an on-off period (that is, a stimulus "on" phase followed by a stimulus "off" phase) is repeated several times.

If a correlation analysis takes all measuring time points into consideration, the sensitivity for changes of the signal-response form decreases with each activation cycle. However, the prior art methods do not provide for a uniform sensitivity for the change of the signal response form.

It is therefore the principal object of the present invention to provide a computer and a nuclear magnetic resonance tomograph, which deliver improved analysis results. It is a particular object to provide for a uniform sensitivity for the changes of the signal response form. Also, a computer and a nuclear magnetic resonance tomograph are to be provided which permit the implementation of such a solution. For this purpose, a new detrending procedure for the reduction of undesired low-frequency components in the measured signals is to be developed, whereby the implementation is made possible.

SUMMARY OF THE INVENTION

In a computer for evaluating signals from nuclear magnetic resonance tomography and a tomograph using such a computer, the neuronal activity measured during a nuclear magnetic resonance tomographic examination follows a protocol, which describes the timing of the stimuli. During a correlation analysis, the sensitivity of known means to changes in the signal-response form normally decreases with each activation cycle. According to the invention, better evaluation results can be achieved in the correlation analysis by using a constant number of n data values in a correlation analysis employing a sliding-window technique. As the data measurement progresses, the oldest value is continuously disposed of and replaced by the most recent data value in the calculation.

The computer provides for a uniform sensitivity for the changes of the signal response form by utilizing a combination of the equations (1), (4), and (5) below. In a first step, the vectors $\vec{\gamma}$ and $\vec{\delta}$ are calculated in accordance with equations (2) and (3) which vectors are composed of the detrending coefficients $\gamma_i$ and respectively, $\delta_i$ ($\vec{\gamma} = (\gamma_o, \gamma_i \ldots)^T$, $\vec{\delta} = (\delta_o, \delta_i \ldots)^T$. The equations are obtained by minimizing two square functions. The detrending matrix S includes $s_i$ as column vectors.

$$(S^T S)\vec{\gamma} = S^T \vec{x} \quad (2)$$

$$(S^T S)\vec{\delta} = S^T \vec{r} \quad (3)$$

wherein:

S=detrending matrix with $\vec{s}_i$ as column vectors $S^T$=transposed of S (matrix is mirrored along its diagonal)

$\vec{x}$ =measurement vector; includes the measured time series of a voxel $\vec{r}$ =reference vector; includes the model time series T=symbol for transposed of a matrix, $\vec{\gamma}$ =vector which includes the coefficients of the detrending vectors for the calculations of $\vec{x}_s$.

$\vec{\delta}$ =vector which includes the coefficients of the detrending vectors for the calculation of $\vec{r}_s$.

These linear equation systems are solved mathematically efficiently for example by the method of conjugate gradients, if the reference vector varies spatially, or, otherwise, in the simplest way, by multiplication of the inverse matrix which can be determined by means of the method of conjugate gradients. Other methods may be used which are however less efficient. It is possible to transform the extended correlation equation until only such terms remain which can be iteratively calculated. In this way, the correlation coefficients themselves can be iteratively calculated.

In a second step, the expressions for $\vec{x}_s$ and $\vec{r}_s$ are substituted in accordance with the formula (4) and (5):

$$\vec{x}_S = \vec{x} - \sum_{i=0}^{L-1} \gamma_i \vec{s}_i \quad (4)$$

$$\vec{r}_S = \vec{r} - \sum_{i=0}^{L-1} \delta_i \vec{s}_i \quad (5)$$

wherein:

$\vec{x}$ =measurement vector; includes the measured time series of a voxel

L=number of detrending vectors $\gamma_i$=coefficients of the detrending vectors for the calculation of $x_s$ $\vec{r}$ =reference vector $\delta_i$=coefficients of the detrending vectors for the calculation of $r_s$ $\vec{x}_s$=measurement vector after detrending $\vec{r}_s$=reference vector after detrending $\vec{s}_i$=detrending vectors S=detrending matrix with $S_i$ being column vectors By combining the formulae (1), (4), and (5), formula (6) is derived which represents the basis for the calculation of the correlation coefficients in accordance with the invention, such. that a uniform sensitivity of the calculated values for the changes of the signal response form is guaranteed. The expression for the correlation obtained therewith can be formulated in terms of sub-expressions, which can be iteratively calculated.

In order to guarantee now a uniformly high sensitivity for changes of the signal response form, the "sliding-Window" technique was developed, wherein the correlation is limited in accordance with the invention to the n last magnetic resonance data sets. The number n of data sets included in the calculation can be freely selected. Preferably, the number n is maintained constant during a measuring procedure but, while maintaining the iterative computability of ρ, the window width can be increased or reduced by one in each time step, or, with a correspondingly increased calculation effort, the window width can be changed as desired The correlation computation includes the respective newly added data value while the oldest data value contained in the data window of n elements used for the computation is discarded. A data window always consists of n data sets, which may be especially two- or three-dimensional, wherein n may be for example between 10 and 20. The selection of this window width (=number of data employed) is decided upon by the person performing the experiments and depends, for example, on the desired sensitivity for the changes of the measured neural activation and the time between two measurements.

A data value in the sense of the invention is to be understood to be an individual number such as an integer number value or an floating point value measured at a particular time point. One data value is assigned to one voxel. A data set is a collection of data values, which belong to a measuring time. A data set comprises the data values of all voxels or a partial amount of all voxels. A data set may comprise one or several slices.

In the method used by R. W. Cox, the correlation analysis occurs exclusively in a cumulative manner, that is, all data sets recorded from the beginning of the measurements enter the correlation computation. As a result, in this state of the art method, the deviations of the measuring signals from the model functions have a smaller effect on the correlation coefficient the later they occur. In contrast thereto, the sliding-window technique according to the invention provides for a uniform sensitivity for the changes of the signal response form. During the initial fill-up phase, the sliding-window method corresponds to a cumulative correlation. Thereafter, the phase of the "stationary equilibrium" follows (that means the number of data values n remains constant, wherein with progressing measurement, the oldest data value is eliminated while the newest data value is added) which, like in the Cox algorithm, requires for each time step, a constant calculation effort.

The algorithm developed for performing the sliding-window procedure is represented by the general formula (6):

$$\rho = \frac{\vec{x}\vec{r} - \sum_i \delta_i \vec{x}\vec{s}_i}{\sqrt{h_1 h_2}} \quad (6)$$

wherein:

$\vec{x}$ =measurement vector $\vec{r}$ =reference vector i=index variable, which extends over N data sets $\delta_i$=coefficients of the detrending vectors for the calculation of $\vec{r}_s$ $\vec{s}_i$=detrending vectors $h_i$ and $h_2$ are defined by the formulae (7) and (8):

$$h_1 = \vec{x}^2 - 2\sum_i \gamma_i \vec{x}\vec{s}_i + 2\sum_{i>j} \gamma_i \gamma_j \vec{s}_i \vec{s}_j + \sum_i \gamma_i^2 \vec{s}_i^2 \quad (7)$$

$$h_2 = \vec{r}^2 - 2\sum_i \delta_i \vec{r}\vec{s}_i + 2\sum_{i>j} \delta_i \delta_j \vec{s}_i \vec{s}_j + \sum_i \delta_i^2 \vec{s}_i^2 \quad (8)$$

wherein:

$\gamma_i$, $\gamma_j$=detrending coefficients for the calculation of $x_s$ $s_j$=detrending vectors s=detrending matrix which includes the $s_i$ as column vectors.

In a specialized formulation, $\rho$ is obtained in accordance with formula (9):

$$\rho = \frac{a - b\frac{c}{N}}{\sqrt{d - \frac{b^2}{N}} \sqrt{e - \frac{c^2}{N}}} \quad (9)$$

wherein:

N=number of measuring points in the measuring window or current number of measuring points (particularly during the initial phase of the correlation computations)

In the equations (10) to (14) a, b, c, d and e are defined as follows:

$$a = \sum_i x_i r_i \quad (10)$$

$$b = \sum_i r_i = N\bar{r} \quad (11)$$

$$c = \sum_i r_i = N\bar{x} \quad (12)$$

$$d = \sum_i r_i^2 \quad (13)$$

$$e = \sum_i x_i^2 \quad (14)$$

wherein:

$\vec{x}$ =average value of N measured values $\vec{r}$ =average value of N components of the reference vector $r_i$ components of the reference vector $x_i$ components of the measurement vector The data sets entering the correlation computation for the equations (6) and (9) as well as (1) can be weighted depending on their index number.

The computation time for a correlation image in accordance with the algorithm according to the invention following formula (6) does not depend on the window width, that is the number n (N may indicate any desired number of data values or data sets; if the sliding-window method is used, for the stationary case N=n).

If there is a (time-dependent) shift between measurement and detrending vector, the scalar product between the vectors can no longer be calculated iteratively. As a result, the detrending vectors can no longer be constant but must be moved as sliding-windows over predetermined number series.

For the detrending vectors, the following selection can be made:

It is assumed that the detrending vectors are the vectors with the elements $t^i$, wherein i numbers the detrending vectors and t runs from the smallest to the largest index number of all magnetic resonance data sets taken into consideration for the correlation. These detrending vectors are called polynomial. The series $t^i$ are increasing monotonically. This results—disregarding small fluctuations—in a general decrease of the detrending coefficient during the measurement procedure, since they have to compensate for the increase of the series. A direct visualization of the detrending coefficient would therefore be meaningless. Independent of the experiments performed, similar decreases of the detrending coefficient during the measurement would then occur. These coefficients would provide information concerning the time-dependent changes of the low frequency noise components, which would be difficult to interpret.

In the present case, the coefficients can be easily transformed, in accordance with formula (15) into the values $\gamma_k$ which one would obtain with a set of constant detrending vectors:

$$\tilde{\gamma}_k = \sum_{i \geq k}^{L-1} \gamma_i \binom{i}{k} t_0^{i-k}, \quad (15)$$

wherein:

$\tilde{\gamma}_k$=corrected γ-coefficients

L=number of detrending vectors i=index variable k=index variable $t_o$=origin of the sliding-window relative to the beginning of the measurement $\gamma_i$=uncorrected γ coefficient the index $t_o$ is the index of the oldest data set in the window (buffer).

The matrix multiplication is utilized for the vector with the detrending coefficients in each voxel for each time step. The computation efforts for the correction of the detrending coefficients are typically smaller than those for the actual correlation. The subsequent linear transformation of the detrending coefficients, which were determined by the systems of linear equation systems, are required for obtaining from the coefficients information in addition to the correlation coefficients. The additional information comprises particulars concerning the strength of the individual low frequency noise components.

For the instance of non-polynomial detrending vectors, appropriate formulae can be derived. By Taylor expansion of the functions on which the non-polynomial detrending vectors are based, the more general case can be reduced to the case of polynomial detrending vectors.

The correlation results depend decidedly on the selection of the reference vector. Starting with a reference vector, which provides a correlation value at least for some image points (pixels), which correlation value is above a certain threshold (for example 0.5), an iterative improvement can be performed. To this end, a vector is generated by component-wise averaging of the time sequences, whose correlation values are above the threshold, and this vector is used as reference vector for a new correlation computation. The mathematical formulation of this procedure is given in formula (16):

$$T_i = \frac{\sum_{\forall pixels(k,l) \land p(k,l) > t} x_{i,k,l}}{\sum_{\forall pixels(k,l) \land p(k,l) > t} 1} \quad (16)$$

wherein:

k, l=pixel coordinates

ρ=correlation coefficient t=correlation threshold (may be between −1 and 1 and must be exceeded by the correlation values for a consideration of the respective measurement vector in the sum). $r_i$=the $i^{th}$ component of the reference vector $x_{i,k,l}$=the $i_{th}$ component of the time sequence of the pixel with the coordinates k, l.

With the new reference vector, a new correlation computation is performed. This procedure, which comprises the calculation of the new reference vector and the correlation coefficients and which is considered to be an iteration step, can be repeated several times whereby the reference vector is optimized: Again the time series for the generation of the reference vector are averaged whose respective correlation coefficient is above the predetermined threshold value. The optimizing occurs by adaptation of the reference vector to the time series, which have the highest correlation coefficients. The threshold can be changed from iteration step to iteration step for example in order to limit the selection of the time series to be averaged. The procedure can also be applied to partial areas for which there are individual reference vectors.

Evaluation of the method according to the invention:

In the stationary equilibrium, the computation time with a SUN Ultra Sparc (143 MHz) for a correlation image with a matrix size of 64×64 pixels and a detrending vector with identical entries is 0.13 s. Together, with the time required for the scaling of the original and the correlation image of 256×256 pixels by means of bi-linear interpolation a rate of 2 fps (frames per second) was obtained. The implementations of the algorithms according to the invention were compared with the correlation module of the AFNI (Analysis of Functional Neuro Images) software package with respect to speed, which according to the program description is based on the algorithm described in the publication of Cox, R. W., Jesmanowicz A., Hyde, J. S., Magn. Reson. Med. 33, 230, 1995. The software package is described in the publication of Cox R. W. Comput. Biomed. Res. 29, 162, 1996. Comparable computing times were determined. (Because of the missing sliding-window capability, the comparisons have however only limited value.) During the speed test of the real-time software developed by the applicants, the correlation is performed only with one reference vector, which is constant during a measurement. This however is no limitation in principle. The computation was performed also with only one detrending vector with constant elements.

In summary, it can be said that the computer equipped with the algorithm according to the invention delivers with comparable computing times better results.

The way the computer operates in accordance with the invention is not limited to real time measurements. It is also possible to employ measurement values, which are stored in data storage devices.

Also data values and data sets from nuclear magnetic resonance spectroscopy measurements can be evaluated by the computer according to the invention. Consequently, also any nuclear magnetic resonance spectrometer should be included in the term nuclear spin tomograph. In accordance with the invention, the computer includes evaluation means, which operate according to the formula (2), (3) and (6) to (16) or the mathematical equivalent expressions thereof. These means could be chips or respectively, integrated circuits, that is, particularly processors or programmable logic components.

With the computer according to the invention and with the nuclear spin tomograph utilizing this computer, it can also be determined if a patient is susceptible to a stroke so that important decisions can be more competently made before surgeries. In addition, therapy plans and surgery planning for stroke patients can be performed and supported.

Furthermore, the blood supply to all organs can be determined.

The essential steps of the operating method of the computer according to the invention and of the nuclear resonance tomograph are here shortly summarized:

First, the number of detrending vectors L and the window width n are determined. Storage for the required auxiliary variables of the equations (2), (3) and (6) or respectively, (9) is allocated. Also, the correct initialization values are determined. For the equation (6) as well as the equation (9), a distinction between the "fillup" mode (cumulative correlation at the beginning of the computation) and the stationary phase has to be made.

In the first case, only numbers are added to the auxiliary variables (in equation (9), a, b, c, d, and e are the auxiliary variables; in equation (6) an auxiliary variable is assigned to each sum), in the last case, additionally values are subtracted.

If the equation (6) is used, the detrending coefficient must be calculated using the formulae (2) and (3). The matrices of the systems of equation (dimensions L×L) and the vectors on the right side of the equal sign can be iteratively actualized with each time step. After actualization of the auxiliary variables of the equation (6), the correlation coefficient can be calculated according to the formula (6). The solution of the formula (9) follows correspondingly. In this case, equations (2) and (3) are not used. In the examples, the correlation computation for a single correlation value is demonstrated wherein three polynomial detrending vectors were selected ($t^0$, $t^1$, $t^2$). In the first example, the reference and the measurement vectors of an actual experiment were used; in the second example, they were generated by chance.

Below, the calculation examples 1 and 2 are presented:

EXAMPLE 1

CONTROL

| Referenz-Vector (r) | Measuring Vector (x) | Detrending-Vector1 (d1) | Detrending-Vector2 (d2) | Detrending-Vector3 (d3) | xi*d1i | xi*d2i |
|---|---|---|---|---|---|---|
| −1 | 820 | 1 | 0 | 0 | 820 | 0 |
| 1 | 840 | 1 | 0.04166667 | 0.00173611 | 840 | 35 |
| 1 | 804 | 1 | 0.08333333 | 0.00694444 | 804 | 67 |
| 1 | 841 | 1 | 0.125 | 0.015625 | 841 | 105.125 |
| −1 | 837 | 1 | 0.16666667 | 0.02777778 | 837 | 139.5 |
| −1 | 863 | 1 | 0.20833333 | 0.04340278 | 863 | 179.791667 |
| −1 | 867 | 1 | 0.25 | 0.0625 | 867 | 216.75 |
| −1 | 835 | 1 | 0.29166667 | 0.08506944 | 835 | 243.541667 |
| −1 | 827 | 1 | 0.33333333 | 0.11111111 | 827 | 275.666667 |
| −1 | 817 | 1 | 0.375 | 0.140625 | 817 | 306.375 |
|  |  |  |  |  | 8351 | 1568.75 |

| | Matrix A | | | | | |
|---|---|---|---|---|---|---|
|  | 10 | 1.875 | 0.49479167 |  |  |  |
|  | 1.875 | 0.49479167 | 0.14648438 |  |  |  |
|  | 0.49479167 | 0.14648438 | 0.04621492 |  |  |  |
| 0.0022794 | inverse A | | | | | |
|  | 0.61818182 | −6.2181818 | 13.0909091 |  |  |  |
|  | −6.2181818 | 95.3454545 | −235.63636 |  |  |  |
|  | 13.0909091 | −235.63636 | 628.363636 |  |  |  |
|  | Vector b | gamma | | | | |
|  | 8351 | 812.754545 | | | | |
|  | 1568.75 | 353.509091 | | | | |
|  | 412.888889 | −888 | | | | |
|  | Vector d | delta | | | | |
|  | −4 | 0.23636364 | | | | |
|  | −1.375 | −1.0909091 | | | | |
|  | −0.4461806 | −8.7272727 | | | | |
|  | rho | | | | | |
|  | −0.3687532 | | | | | |

| xi*d3i | ri*d1i | ri*d2i | ri*d3i | A11 | A12 | A22 |
|---|---|---|---|---|---|---|
| 0 | −1 | 0 | 0 | 1 | 0 | 0 |
| 1.45833333 | 1 | 0.04166667 | 0.00173611 | 1 | 0.04166667 | 0.00173611 |
| 5.58333333 | 1 | 0.08333333 | 0.00694444 | 1 | 0.08333333 | 0.00694444 |
| 13.140625 | 1 | 0.125 | 0.015625 | 1 | 0.125 | 0.015625 |
| 23.25 | −1 | −0.1666667 | −0.0277778 | 1 | 0.16666667 | 0.02777778 |
| 37.4565972 | −1 | −0.2083333 | −0.0434028 | 1 | 0.20833333 | 0.04340278 |
| 54.1875 | −1 | −0.25 | −0.0625 | 1 | 0.25 | 0.0625 |
| 71.0329861 | −1 | −0.2916667 | −0.0850694 | 1 | 0.29166667 | 0.08506944 |
| 91.8888889 | −1 | −0.3333333 | −0.1111111 | 1 | 0.33333333 | 0.11111111 |
| 114.890625 | −1 | −0.375 | −0.140625 | 1 | 0.375 | 0.140625 |
| 412.888889 | −4 | −1.375 | −0.4461806 | 10 | 1.875 | 0.49479167 |

| | | | Projection of x | | Projection of r | |
|---|---|---|---|---|---|---|
| A13 | A23 | A33 | Px | (Pxi)^2 | Pr | (Pri)^2 |
| 0 | 0 | 0 | 7.24545455 | 52.4966116 | −1.2363636 | 1.52859504 |
| 0.00173611 | 7.2338E−05 | 3.0141E−06 | 14.0575758 | 197.615436 | 0.82424242 | 0.67937557 |
| 0.00694444 | 0.0005787 | 4.8225E−05 | −32.04697 | 1027.00827 | 0.91515152 | 0.8375023 |
| 0.015625 | 0.00195313 | 0.00024414 | −2.0681818 | 4.27737603 | 1.03636364 | 1.07404959 |
| 0.02777778 | 0.00462963 | 0.0007716 | −10.006061 | 100.121249 | −0.8121212 | 0.65954086 |
| 0.04340278 | 0.00904225 | 0.0018838 | 15.1393939 | 229.201249 | −0.630303 | 0.39728191 |

EXAMPLE 1-continued

| | | | CONTROL | | | |
|---|---|---|---|---|---|---|
| 0.0625 | 0.015625 | 0.00390625 | 21.3681818 | 456.599194 | −0.4181818 | 0.17487603 |
| 0.08506944 | 0.02481192 | 0.00723681 | −5.319697 | 28.2991758 | −0.1757576 | 0.03089073 |
| 0.11111111 | 0.03703704 | 0.01234568 | −4.9242424 | 24.2481635 | 0.0969697 | 0.00940312 |
| 0.140625 | 0.05273438 | 0.01977539 | −3.4454545 | 11.871157 | 0.4 | 0.16 |
| 0.49479167 | 0.14648438 | 0.04621492 | | 46.170747 | | 2.35616535 |

| | rpx |
|---|---|
| | −7.2454545 |
| | 14.0575758 |
| | −32.04697 |
| | −2.0681818 |
| | 10.0060606 |
| | −15.139394 |
| | −21.368182 |
| | 5.31969697 |
| | 4.92424242 |
| | 3.44545455 |
| | −40.115152 |

| Example 2 | | | CONTROL | | | |
|---|---|---|---|---|---|---|
| Reference Vector (r) | Measuring vector (x) | Detrending-Vector1 (d1) | Detrending-Vector2 (d2) | Detrending-Vector3 (d3) | xi*d1i | xi*d2i |
| −0.0901696 | 0.86687368 | 1 | 0 | 0 | 0.86687368 | 0 |
| −0.8732171 | −0.0109559 | 1 | 0.04166667 | 0.00173611 | −0.0109559 | −0.0004565 |
| 0.55787935 | 0.82458951 | 1 | 0.08333333 | 0.00694444 | 0.82458951 | 0.06871579 |
| −0.64421 | 0.71624441 | 1 | 0.125 | 0.015625 | 0.71624441 | 0.08953055 |
| −0.3638101 | 0.65897313 | 1 | 0.16666667 | 0.02777778 | 0.65897313 | 0.10982886 |
| −0.5565415 | 0.19779154 | 1 | 0.20833333 | 0.04340278 | 0.19779154 | 0.04120657 |
| 0.62847406 | 0.93335457 | 1 | 0.25 | 0.0625 | 0.93335457 | 0.23333864 |
| 0.6663485 | 0.89791033 | 1 | 0.29166667 | 0.08506944 | 0.89791033 | 0.26189051 |
| 0.63126889 | 0.80000471 | 1 | 0.33333333 | 0.11111111 | 0.80000471 | 0.26666824 |
| 0.11439662 | −0.7310715 | 1 | 0.375 | 0.140625 | −0.7310715 | −0.2741518 |
| −0.0881377 | 0.5695818 | 1 | 0.41666667 | 0.17361111 | 0.5695818 | 0.23732575 |
| 0.82245743 | 0.28549038 | 1 | 0.45833333 | 0.21006944 | 0.28549038 | 0.13084976 |
| −0.2228839 | 0.22365164 | 1 | 0.5 | 0.25 | 0.22365164 | 0.11182582 |
| −0.520496 | 0.90538431 | 1 | 0.54166667 | 0.29340278 | 0.90538431 | 0.4904165 |
| 0.63183051 | 0.20197755 | 1 | 0.58333333 | 0.34027778 | 0.20197755 | 0.11782024 |
| −0.3699006 | 0.0441816 | 1 | 0.625 | 0.390625 | 0.0441816 | 0.0276135 |
| −0.3707666 | 0.33015254 | 1 | 0.66666667 | 0.44444444 | 0.33015254 | 0.2201017 |
| −0.8766027 | 0.85078584 | 1 | 0.70833333 | 0.50173611 | 0.84078584 | 0.60263997 |
| −0.6929535 | −0.0096465 | 1 | 0.75 | 0.5625 | −0.0096465 | −0.0072348 |
| 0.92588962 | −0.3152563 | 1 | 0.79166667 | 0.62673611 | −0.3152563 | −0.2495779 |
| −0.4154246 | 0.29096348 | 1 | 0.83333333 | 0.69444444 | 0.29096348 | 0.24246957 |
| 0.53772851 | −0.0250258 | 1 | 0.875 | 0.765625 | −0.0250258 | −0.0218975 |
| −0.5456474 | 0.644561 | 1 | 0.91666667 | 0.84027778 | 0.644561 | 0.59084758 |
| −0.3807277 | 0.65621669 | 1 | 0.95833333 | 0.91840278 | 0.65621669 | 0.62887433 |
| | | | | | 9.80673281 | 3.9186453 |
| | Matrix A | | | | | |
| | 24 | 11.5 | 7.50694444 | | | |
| | 11.5 | 7.50694444 | 5.51041667 | | | |
| | 7.50694444 | 5.51041667 | 4.31388648 | | | |
| 6.33350681 | inverse A | | | | | |
| | 0.31884615 | −1.3015385 | 1.10769231 | | | |
| | −1.3015385 | 7.44912131 | −7.2503497 | | | |
| | 1.10769231 | −7.2503497 | 7.56558224 | | | |
| | Vector b | gamma | | | | |
| | 9.80673281 | 0.71689642 | | | | |
| | 3.9186453 | −1.1827754 | | | | |
| | 2.42876559 | 0.82631973 | | | | |
| | Vector d | delta | | | | |
| | −1.4952156 | −0.2761552 | | | | |
| | −0.9535108 | 1.65343167 | | | | |
| | −0.9392883 | −1.8492151 | | | | |
| | rho | | | | | |
| | −0.0381978 | | | | | |

-continued

Example 2 CONTROL

| xi*d3i | ri*d1i | ri*d2i | ri*d3i | A11 | A12 | A22 |
|---|---|---|---|---|---|---|
| 0 | −0.0901696 | 0 | 0 | 1 | 0 | 0 |
| −1.902E−05 | −0.8732171 | −0.036384 | −0.001516 | 1 | 0.04166667 | 0.00173611 |
| 0.00572632 | 0.44787935 | 0.04648995 | 0.00387416 | 1 | 0.08333333 | 0.00694444 |
| 0.01119132 | −0.64421 | −0.0805263 | −0.0100658 | 1 | 0.125 | 0.015625 |
| 0.01830481 | −0.3638101 | −0.060635 | −0.0101058 | 1 | 0.16666667 | 0.02777778 |
| 0.0085847 | −0.5565415 | −0.1159461 | −0.0241554 | 1 | 0.20833333 | 0.04340278 |
| 0.05833466 | 0.62847406 | 0.15711851 | 0.03927963 | 1 | 0.25 | 0.0625 |
| 0.07638473 | 0.6663485 | 0.19435166 | 0.0566859 | 1 | 0.29166667 | 0.08506944 |
| 0.08888941 | 0.63126889 | 0.21042296 | 0.07014099 | 1 | 0.33333333 | 0.11111111 |
| −0.1028069 | 0.11439662 | 0.04289873 | 0.01608702 | 1 | 0.375 | 0.140625 |
| 0.09888573 | −0.0881377 | −0.036724 | −0.0153017 | 1 | 0.41666667 | 0.17361111 |
| 0.05997281 | 0.82245743 | 0.37695966 | 0.17277318 | 1 | 0.45833333 | 0.21006944 |
| 0.05591291 | −0.2228839 | −0.111442 | −0.055721 | 1 | 0.5 | 0.25 |
| 0.26564227 | −0.520496 | −0.2819353 | −0.152715 | 1 | 0.54166667 | 0.29340278 |
| 0.06872847 | 0.63183051 | 0.3685678 | 0.21499788 | 1 | 0.58333333 | 0.34027778 |
| 0.01725844 | −0.3699006 | −0.2311879 | −0.1444924 | 1 | 0.625 | 0.390625 |
| 0.14673446 | −0.3707666 | −0.2471778 | −0.1647852 | 1 | 0.66666667 | 0.44444444 |
| 0.42686998 | −0.8766027 | −0.6209269 | −0.4398233 | 1 | 0.70833333 | 0.50173611 |
| −0.0054261 | −0.6929535 | −0.5197152 | −0.3897864 | 1 | 0.75 | 0.5625 |
| −0.1975825 | 0.92588962 | 0.73299595 | 0.58028846 | 1 | 0.79166667 | 0.62673611 |
| 0.20205797 | −0.4154246 | −0.3461872 | −0.2884893 | 1 | 0.83333333 | 0.69444444 |
| −0.0191604 | 0.53772851 | 0.47051245 | 0.41169839 | 1 | 0.875 | 0.765625 |
| 0.54161028 | −0.5456474 | −0.5001768 | −0.4584954 | 1 | 0.91666667 | 0.8402778 |
| 0.60267123 | −0.3807277 | −0.364864 | −0.3496613 | 1 | 0.95833333 | 0.91840278 |
| 2.42876559 | −1.4952156 | −0.9535108 | −0.9392883 | 24 | 11.5 | 7.50694444 |

| | | | Projection of x | | Projection of r | | |
|---|---|---|---|---|---|---|---|
| A13 | A23 | A33 | Px | (Pxi)^2 | Pr | (Pri)^2 | rpx |
| 0 | 0 | 0 | 0.14997725 | 0.02249318 | 0.18598558 | 0.03459064 | −0.0135234 |
| 0.00173611 | 7.2338E−05 | 3.0141E−06 | −0.6800046 | 0.46240627 | −0.662744 | 0.43923015 | 0.59379163 |
| 0.00694444 | 0.0005787 | 4.8225E−05 | 0.20051938 | 0.04020802 | 0.70909035 | 0.50280912 | 0.11186562 |
| 0.015625 | 0.00195313 | 0.00024414 | 0.13428367 | 0.0180321 | −0.5458398 | 0.29794107 | −0.0865069 |
| 0.02777778 | 0.00462963 | 0.0007716 | 0.11625262 | 0.01351467 | −0.3118598 | 0.09725652 | −0.0422939 |
| 0.04340278 | 0.00904225 | 0.0018838 | −0.3085579 | 0.09520798 | −0.5445902 | 0.29657846 | 0.17172528 |
| 0.0625 | 0.015625 | 0.00390625 | 0.46040703 | 0.21206672 | 0.60684728 | 0.36826362 | 0.28941672 |
| 0.08506944 | 0.02481192 | 0.00723681 | 0.45569552 | 0.20765841 | 0.61756449 | 0.3813859 | 0.30365202 |
| 0.11111111 | 0.03703704 | 0.01234568 | 0.38555347 | 0.14865148 | 0.56174854 | 0.31556142 | 0.24338791 |
| 0.140625 | 0.05273438 | 0.01977539 | −1.1206283 | 1.25580785 | 0.03056081 | 0.00093396 | −0.1281961 |
| 0.17361111 | 0.07233796 | 0.03014082 | 0.20205019 | 0.04082428 | −0.1798681 | 0.03235252 | −0.0178082 |
| 0.21006944 | 0.09628183 | 0.04412917 | −0.0628852 | 0.00395454 | 0.72925337 | 0.53181048 | −0.0517204 |
| 0.25 | 0.125 | 0.0625 | −0.108437 | 0.01175858 | −0.3111408 | 0.0968086 | 0.02416886 |
| 0.29340278 | 0.1589265 | 0.08608519 | 0.58671342 | 0.34423264 | −0.5973847 | 0.35686852 | −0.305382 |
| 0.34027778 | 0.19849537 | 0.11578897 | −0.1061448 | 0.01126671 | 0.57273071 | 0.32802046 | −0.0670655 |
| 0.390625 | 0.24414063 | 0.15258789 | −0.2562613 | 0.06566986 | −0.4047905 | 0.16385536 | 0.0947912 |
| 0.44444444 | 0.2962963 | 0.19753086 | 0.03451987 | 0.00119162 | −0.3750259 | 0.14064439 | −0.0127988 |
| 0.50173611 | 0.35539641 | 0.25173913 | 0.55709424 | 0.31035399 | −0.8438103 | 0.71201586 | −0.4883503 |
| 0.5625 | 0.421875 | 0.31640625 | −0.3042661 | 0.09257789 | −0.6166886 | 0.38030483 | 0.21085231 |
| 0.62673611 | 0.49616609 | 0.39279815 | −0.6136732 | 0.37659479 | 1.05204796 | 1.10680491 | −0.5681936 |
| 0.69444444 | 0.5787037 | 0.48225309 | −0.0141199 | 0.00019937 | −0.232952 | 0.05426662 | 0.00586575 |
| 0.765625 | 0.66992187 | 0.58618164 | −0.3396447 | 0.11535854 | 0.78293631 | 0.61298927 | −0.1826366 |
| 0.8402778 | 0.77025463 | 0.70606678 | 0.3175373 | 0.10082993 | −0.2312836 | 0.05349209 | −0.1732634 |
| 0.91840278 | 0.880136 | 0.84346366 | 0.31391907 | 0.9854518 | 0.00921315 | 8.4882E−05 | −0.1195177 |
| 7.50694444 | 5,51041667 | 4.31388648 | | 2.01231325 | | 2.70275224 | −0.2077495 |

What is claimed is:

1. A computer for the evaluation of data from nuclear spin tomographs employing a correlation analysis which is performed utilizing a detrending procedure, said computer including evaluation means, which, in accordance with a sliding-window procedure, utilize a number of n data values for said correlation analysis, in which, with continuing data measurement, the respective oldest values are discarded and the newest data values are employed in the computation.

2. A computer according to claim 1, wherein the number of n data values utilized for the computation remains constant.

3. A computer according to claim 1, wherein said evaluation means are operative in such a way that the correlation formula $$\rho = \frac{\vec{x}_S \vec{r}_S}{|\vec{x}_S||\vec{r}_S|}$$

is transformed in such a way that at least one sub-expression remains which can be iteratively computed.

4. A computer according to claim 3, wherein evaluation means operate in such a way that the formula $$\rho = \frac{\vec{x}_S \vec{r}_S}{|\vec{x}_S||\vec{r}_S|}$$

is transformed in such a way that only sub-expressions remain, which can be iteratively computed.

5. A computer according to claim 1, wherein said sliding-window means are operative by a sliding-window procedure following the formulae:

$$\rho = \frac{\vec{x}\vec{r} - \sum_i \delta_i \vec{x}\vec{s}_i}{\sqrt{h_1 h_2}}.$$

6. A computer according to claim 1, wherein said evaluation means calculate detrending coefficients in γ and δ according to the formulae:

$$(S^T S)\gamma = S^T X$$

$$(S^T S)\delta = S^T r$$

7. A computer according to claim 1, wherein said evaluation means utilize a sliding-window procedure in accordance with the formula:

$$\rho = \frac{a - b\frac{c}{N}}{\sqrt{d - \frac{b^2}{N}}\sqrt{e - \frac{c^2}{N}}}.$$

8. A computer according to claim 5, wherein said evaluation means operate in such a way that a drop of the detrending coefficient resulting from the method is compensated for in an additional computation step.

9. A computer according to claim 8, wherein the evaluation means perform the compensation in accordance with the formula:

$$\tilde{\gamma}_k = \sum_{i \geq k}^{L-1} \gamma_i \binom{i}{k} t_0^{i-k},$$

if polynomial detrending vectors have been chosen.

10. A computer according to claim 1, wherein said evaluation means are adapted to permit calculation with spatially different reference vectors.

11. A computer according to claim 10, wherein said evaluation means are capable of adapting said reference vectors to the time sequences, which have the highest correlation coefficients.

12. A computer according to claim 1, wherein said evaluation means operate in such a way that the reference vectors are optimized based on the initial vectors.

13. A computer according to claim 12, wherein said evaluation means are optimizing said reference vectors in accordance with the formula $$T_i = \frac{\sum_{\forall pixels(k,l) \wedge p(k,l) > t} x_{i,k,l}}{\sum_{\forall pixels(k,l) \wedge p(k,l) > t} 1}.$$

14. A nuclear resonance tomograph including a computer for the evaluation of data from nuclear spin tomographs wherein a correlation analysis is performed utilizing a detrending procedure, said computer including evaluation means, which, in accordance with a sliding-window procedure, utilize a number of n data values for said correlation analysis, in which, with continuing data measurement, the respective oldest data values are discarded and the newest data values are employed in the computation.

* * * * *